(12) United States Patent
Li (10) Patent No.: US 9,881,989 B2
(45) Date of Patent: Jan. 30, 2018

(54) FLEXIBLE DISPLAY PANEL AND DISPLAY DEVICE

(71) Applicant: Boe Technology Group Co., Ltd., Beijing (CN)

(72) Inventor: Yunfei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/022,600

(22) PCT Filed: Sep. 17, 2015

(86) PCT No.: PCT/CN2015/089831
§ 371 (c)(1),
(2) Date: Mar. 17, 2016

(87) PCT Pub. No.: WO2016/169198
PCT Pub. Date: Oct. 27, 2016

(65) Prior Publication Data
US 2017/0077212 A1    Mar. 16, 2017

(30) Foreign Application Priority Data

Apr. 20, 2015 (CN) .......................... 2015 1 0186722

(51) Int. Cl.
*H01L 27/32* (2006.01)
*H01L 51/00* (2006.01)

(52) U.S. Cl.
CPC ...... *H01L 27/3279* (2013.01); *H01L 51/0097* (2013.01); *H01L 2251/5338* (2013.01); *Y02E 10/549* (2013.01)

(58) Field of Classification Search
CPC ............. H01L 27/3276; H01L 27/3279; H01L 27/3293; H01L 27/3297; H01L 51/0097; H01L 51/5221–51/5234
See application file for complete search history.

(56) References Cited

U.S. PATENT DOCUMENTS

2002/0079503 A1    6/2002  Yamazaki et al.
2003/0173564 A1*   9/2003  Ko ...................... H01L 27/3276
                                                            257/40
(Continued)

FOREIGN PATENT DOCUMENTS

CN    2002108252     4/2002
CN    1360350 A      7/2002
(Continued)

OTHER PUBLICATIONS

International Search Report and Written Opinion from PCT/CN15/89831 dated Jan. 12, 2016.
(Continued)

*Primary Examiner* — Bryan Junge
(74) *Attorney, Agent, or Firm* — Calfee, Halter & Griswold LLP (57) ABSTRACT

The embodiments of the present invention provide a flexible display panel and a display device comprising the flexible display panel. The flexible display panel comprises a plurality of effective display regions, each effective display region comprising a pixel array; and at least one power supply lead region, which comprises at least one power supply lead in electrical connection with a power supply line of the flexible display panel; and the effective display regions and the power supply lead region are arranged alternately. For display devices using the flexible display panel according to the embodiments of the present invention, especially those having a larger size or higher resolution, the luminance uniformity can be improved and enhanced, and the advantages of the flexible display device can be further strengthened.

12 Claims, 4 Drawing Sheets

(56) References Cited

U.S. PATENT DOCUMENTS

| | | | | |
|---|---|---|---|---|
| 2005/0264498 A1* | 12/2005 | Asano | ............... | G09G 3/3233 345/76 |
| 2006/0145606 A1* | 7/2006 | Lee | ................ | H01L 27/3276 313/509 |
| 2007/0120473 A1* | 5/2007 | Nakamura | .......... | H01L 27/3279 313/506 |
| 2009/0079679 A1* | 3/2009 | Nam | ................ | G09G 3/3233 345/82 |
| 2012/0268445 A1* | 10/2012 | Ogata | ............... | H01L 27/3293 345/212 |
| 2015/0187279 A1* | 7/2015 | Lee | ................ | G09G 3/3225 257/40 |

FOREIGN PATENT DOCUMENTS

| | | |
|---|---|---|
| CN | 101131800 | 2/2008 |
| CN | 202150459 | 2/2012 |
| CN | 103745985 | 4/2014 |
| CN | 104916660 | 9/2015 |
| JP | 2002108252 A | 4/2002 |

OTHER PUBLICATIONS

First Office Action for Chinese Patent Application No. 201510186722.5 dated Jun. 2, 2017.
Second Office Action for Chinese Patent Application No. 201510186722.5 dated Oct. 24, 2017.

\* cited by examiner

FLEXIBLE DISPLAY PANEL AND DISPLAY DEVICE

RELATED APPLICATIONS

The present application is the U.S. national phase entry of PCT/CN2015/089831, with an international filling date of Sep. 17, 2015, which claims the benefit of Chinese Patent Application NO. 201510186722.5, filed on Apr. 20, 2015, the entire disclosure of which are incorporated herein by reference.

FIELD OF THE INVENTION

The present invention relates to the field of display technologies, and in particular to a flexible display panel, a display device with the flexible display panel and a method for manufacturing a flexible display panel.

BACKGROUND ART

In recent years, with the development of material technology, display panels that are bendable have become possible. A flexible display is a deformable and bendable display device made of flexible materials. A flexible display panel has many advantages such as low power consumption, direct viewability, bendability, deformability, and portability, and can be mounted on a curved surface and made into a wearable display. It is predicted that flexible display panels may become the mainstream of the display field in the future.

However, the luminance uniformity of the entire screen deteriorates with a gradually increasing screen size and an improved resolution of the display device, which has been a problem existing in various display devices comprising a flexible display panel.

Figure 1:
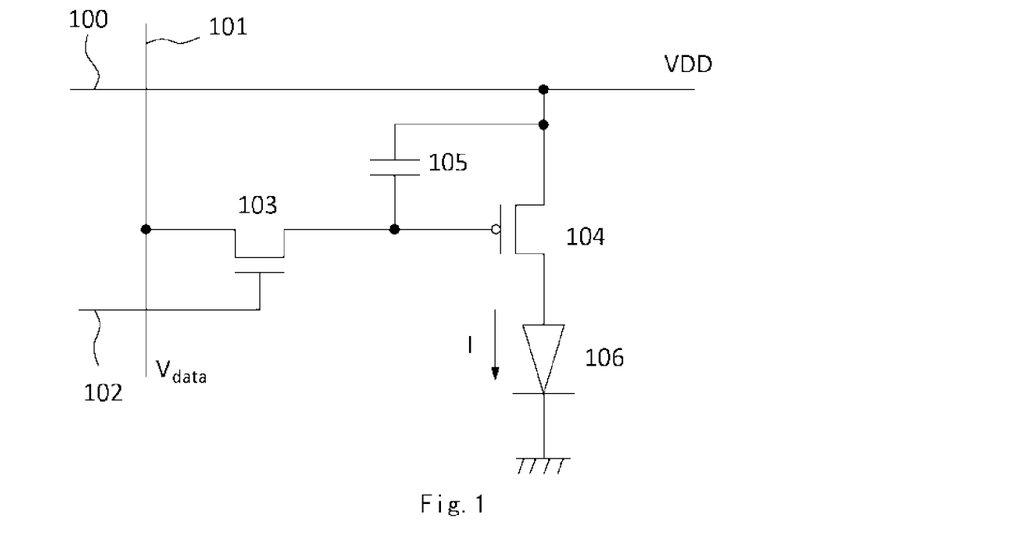
FIG. 1 schematically shows a circuit diagram of a pixel circuit of an ordinary flexible display panel using an OLED element as a light-emitting element.

A flexible display panel usually uses self-luminous devices as light-emitting elements, e.g., an organic light emitting diode (OLED for short). In a display device using OLED elements, the OLED elements are provided with a pixel circuit for dimming. FIG. 1 schematically shows a circuit diagram of a pixel circuit of an ordinary flexible display panel using OLED elements as light-emitting elements. The pixel circuit comprises two thin film transistors (TFT for short) 103 and 104, a capacitance element 105 and an OLED element 106. The source of the TFT 104 is connected to a power supply line 100 that provides a supply voltage VDD, and the drain thereof is connected to the anode of the OLED element 106. The capacitance element 105 is provided between the source and the gate of the TFT 104. The gate of TFT 103 is connected to a scan line 102, and the source thereof is connected to a data line 101 that provides a data voltage $V_{data}$, and the drain thereof is connected to the gate of the TFT 104. When the TFT 103 is switched on by the level of the scan line 102, charges are accumulated from the capacitance element 105 to the gate of the TFT 104 such that the voltage of the gate equals the data voltage $V_{data}$. Then, when the TFT 103 turns into an off state, owing to the charge retention effect of the capacitance element 105, the voltage between the gate and the source of the TFT 104 remains VDD-$V_{data}$. Since the current I passing through the OLED element 106 depends on the voltage between the gate and the source of the TFT 104, and the current I passing through the OLED element 106 determines the luminance of pixels of the flexible display panel, in order to obtain luminance uniformity of the flexible display panel, it is desirable to keep the supply voltage VDD constant in an effective display region. However, a voltage drop will be caused on the power supply wiring from the power supply circuit to the pixel circuit, so the supply voltage applied to each pixel may be different. As can be seen, the voltage drop on the power supply wiring of the display panel is an important reason for the deterioration of the luminance uniformity of the entire screen, hence the voltage drop on the power supply wiring should be decreased as much as possible.

In order to reduce the influence of the voltage drop of the power supply wiring on the luminance uniformity of the display panel, a conventional solution usually designs a corresponding compensation circuit for pixels in each row or each column. Nevertheless, such an approach adds to the complexity of the control circuit of the display panel and is adverse for the accurate control of the display panel. Moreover, it also increases the volume of the display panel and augments the manufacture cost.

SUMMARY

In view of the above problems, the embodiments of the present invention provide a flexible display panel and a display device which can at least alleviate or mitigate the above problems.

According to one aspect of the present invention, a flexible display panel is provided. The flexible display panel comprises: a plurality of effective display regions, each effective display region comprising a pixel array; and at least one power supply lead region, which comprises at least one power supply lead in electrical connection with a power supply line of the flexible display panel; and the effective display regions and the power supply lead region are arranged alternately.

The voltage drop on the power supply line from the power supply circuit of the OLED display panel to each pixel circuit results in a different supply voltage applied to each pixel in the display panel, which is a major reason for luminance non-uniformity of the entire display panel. Therefore, the inventor proposes a flexible display panel with a different power supply wiring than the earlier flexible display panels. As compared with the prior art, a special power supply lead region is arranged in the flexible display panel, so the total resistance of the power supply wiring in the effective display region can be reduced. As a result, the voltage drop on the power supply wiring can be decreased, and thereby the supply voltage VDD of the flexible display panel may be evenly provided to pixel circuits in the effective display region so as to improve the luminance uniformity of the display panel.

In some embodiments, with the characteristics of bendability and deformability of the flexible display panel, the power supply lead region can be concealed behind the plane of the effective display regions of the flexible display panel. By doing this, the overall display effect of the final display device will not be influenced by the power supply region to be arranged.

In some embodiments, the width of the power supply lead is greater than that of the power supply connection line for directly providing an electrical power to the pixels in each effective display region, which may further reduce the total resistance of the power supply wiring in the effective display region, to further decrease the voltage drop on the power supply wiring and improves the luminance uniformity of the display panel.

In some embodiments, the power supply lead region may further comprise a gate driving circuit (GOA circuit). Therefore, the arrangement of a GOA circuit in the power supply lead region not only improves the usage efficiency of the power supply lead region, but also reduces the load for each GOA circuit and enhances the driving capacity of the GOA circuit, which is in turn favorable for improving the luminance uniformity of the entire display panel.

In each embodiment of the present invention, the power supply lead can be either a high level lead in electrical connection with a high level power supply line having a supply level among the power supply lines of the flexible display panel, or a low level lead in electrical connection with a low level power supply line having a low level among the power supply lines of the flexible display panel.

Alternatively, in each embodiment of the present invention, the power supply lead may also comprise both a high level lead in electrical connection with a high level power supply line having a supply level among the power supply lines of the flexible display panel, and a low level lead in electrical connection with a low level power supply line having a low level among the power supply lines of the flexible display panel.

In an embodiment, the high level lead can be arranged in the layer of the gate of a pixel switch in the pixel array, and the low level lead can be arranged in the layer of the source and the drain of the pixel switch in the pixel array.

In some embodiments, the power supply lead region can comprise a high level lead and a low level lead arranged alternately.

In some embodiments, high level leads or low level leads of the power supply leads may be arranged symmetrically in the power supply lead region, such that voltages at respective sides of the power supply lead region are symmetrical, so as to further ensure the overall display effect of the flexible panel.

In some embodiments, the flexible display panel can be an OLED display panel, and the low level lead can be further electrically connected to an OLED cathode via a metal layer, which can further reduce the total resistance of the overall power supply wiring and further improve the luminance uniformity of the display panel.

In some embodiments, the flexible display panel may further comprise another layer of low level leads arranged on the OLED cathode, such that the total resistance of the overall power supply wiring can be further reduced.

According to another aspect of the present invention, a display device is provided. The display device may comprise the flexible display panel as described in any of the embodiments mentioned above.

According to yet another aspect of the present invention, a method for manufacturing a flexible display panel is further provided. The method may comprise: arranging at least one power supply lead region in the flexible display panel, thereby obtaining a plurality of effective display regions of the flexible display panel; arranging at least one power supply lead in the power supply lead region, the power supply lead being in electrical connection with the power supply line of the flexible display panel; and the effective display regions and the power supply lead region are arranged alternately.

According to yet another embodiment of the present invention, the method for manufacturing a flexible display panel may further comprise concealing the power supply lead region behind the plane of the effective display region of the flexible display panel.

With the flexible display panel provided in the embodiments of the present invention or the flexible display panel obtained by using the method for manufacturing a flexible display panel provided in the embodiments of the present invention, the total resistance of the power supply wiring in the effective display region of the flexible display panel can be reduced effectively, and accordingly the voltage drop on the power supply wiring can be decreased. Therefore, for various display devices using the flexible display panel provided in the embodiments of the present invention, especially those having a larger size or higher resolution, the luminance uniformity can be improved and the advantages of the flexible display device can be further strengthened.

BRIEF DESCRIPTION OF DRAWINGS

Now, the concept of the present invention and other advantages will be described with reference to the drawings by using non-limiting embodiments.

DETAILED DESCRIPTION OF EMBODIMENTS

Specific examples of the flexible display panel according to the embodiments of the present invention will be explained exemplarily as follows with reference to the drawings. The drawings are plotted schematically rather than proportionally, for the purpose of explaining the embodiments of the present invention instead of limiting the protection scope of the present invention.

Figure 2A:
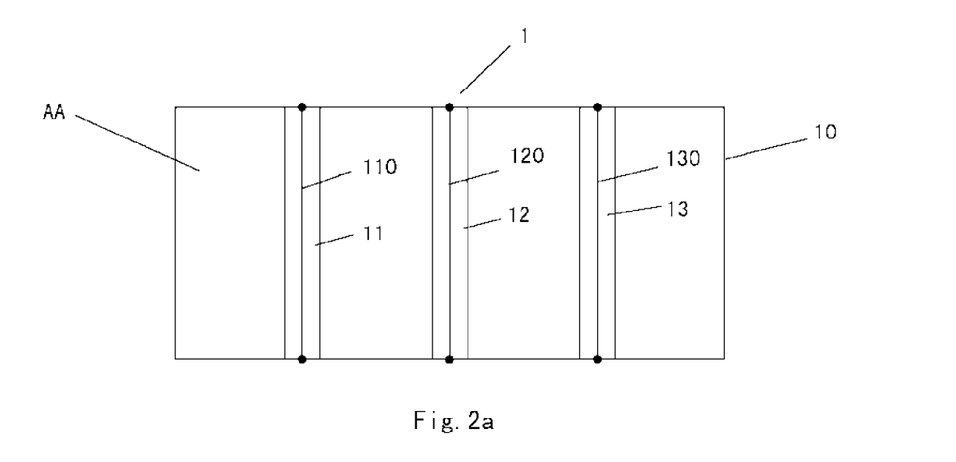
FIG. 2a schematically shows a planar view of a flexible display panel according to one embodiment of the present invention.

FIG. 2a schematically shows a planar view of a flexible display panel 1 according to one embodiment of the present invention. The flexible display panel 1 may comprise a plurality of effective display regions AA, each of which comprises a pixel array; and an at least one power supply lead region, each of which comprises at least one power supply lead in electrical connection with a power supply line 10 of the flexible display panel 1, and the effective display regions AA and the power supply lead regions are arranged alternately. FIG. 2a schematically shows that the flexible display panel 1 comprises three power supply lead regions 11, 12 and 13 arranged longitudinally, thereby obtaining four effective display regions AA. The power supply lead regions 11, 12 and 13 can comprise a power supply lead 110, a power supply lead 120 and a power supply lead 130 in electrical connection with the power supply line 10 respectively. The power supply line 10 may be arranged peripherally around an overall effective display region of the flexible display panel 1 formed by the four effective display regions AA. Obviously, the flexible display panel 1 may comprise even more or less power supply lead regions, each of which can comprise more than one power supply lead.

As compared with the prior art, such a longitudinal arrangement of the power supply lead regions 11, 12 and 13 in the flexible display panel 1 can reduce the total resistance of the power supply wiring for providing a voltage to each pixel circuit in the effective display regions AA. As a result, the voltage drop on the power supply wiring can be decreased and hence the supply voltage VDD of the flexible display panel is provided to each pixel circuit evenly, thereby improving the luminance uniformity of the flexible display panel.

Figure 2B:
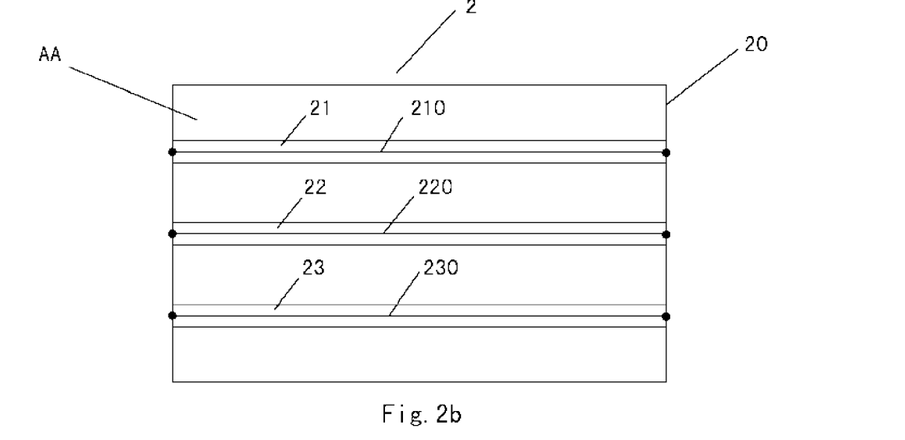
FIG. 2b schematically shows a planar view of a flexible display panel according to another embodiment of the present invention.

FIG. 2b schematically shows a planar view of a flexible display panel 2 according to another embodiment of the present invention. The flexible display panel 2 may comprise a power supply line 20 arranged peripherally around the overall effective display region and three power supply lead regions 21, 22 and 23 in the flexible display panel 2, thereby obtaining four effective display regions AA. Each of the three power supply lead regions 21, 22 and 23 may comprise at least one power supply lead 210, 220 and 230 in electrical connection with the power supply line 20 respectively. The three power supply lead regions 21, 22 and 23 in the flexible display panel 2 of this embodiment are arranged transversally, which is different from the embodiment as shown in FIG. 2a. Such a transversal arrangement of the power supply lead regions 11, 12 and 13 in the flexible display panel 2 can also reduce the total resistance of the power supply wiring for providing a voltage to each pixel circuit in the effective display regions AA. Therefore, the arrangement of power supply leads in this form can also decrease the voltage drop on the power supply wiring and improve the luminance uniformity of the flexible display panel. Likewise, the flexible display panel 2 may comprise even more or less power supply lead regions, each of which can also comprise more than one power supply lead.

It should be noted that the flexible display panels as shown in FIGS. 2a and 2b may not be the final flexible display panel, and it is only for the convenience of explanation that each power supply lead region is highlighted in FIGS. 2a and 2b.

Figure 3:
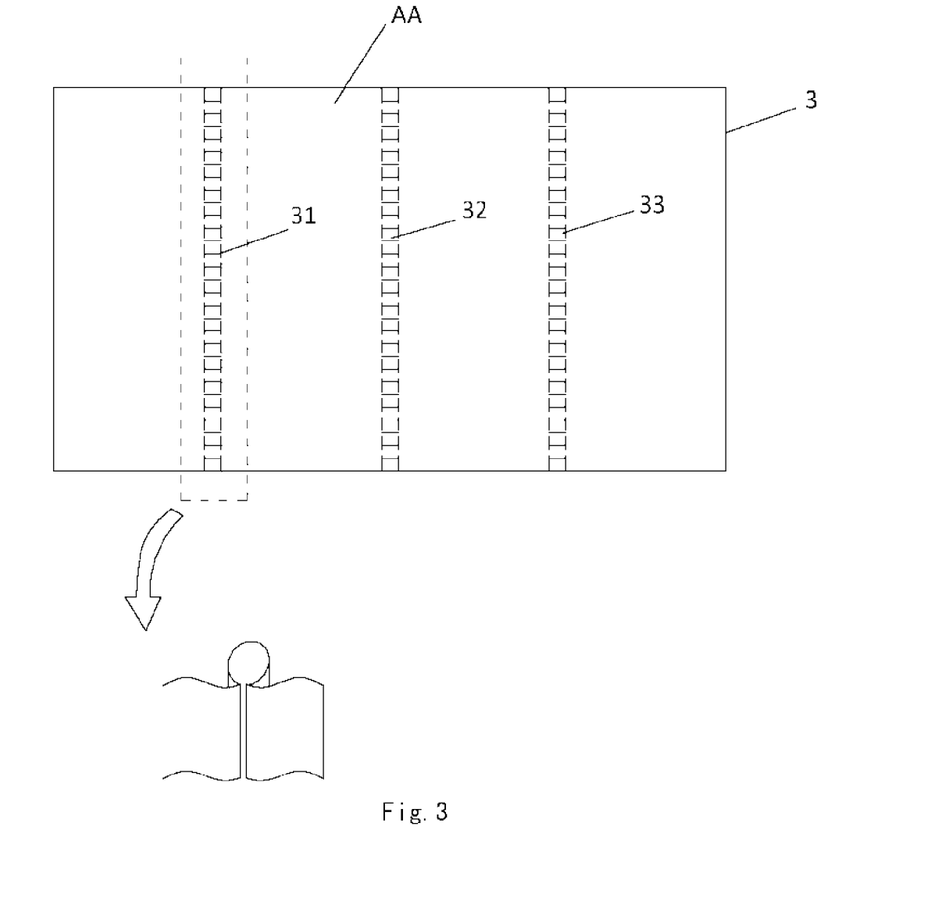
FIG. 3 schematically shows a flexible display panel with a concealed power supply lead region in a more simplified manner.

For example, the power supply lead regions can be concealed behind the plane of the effective display regions of the flexible display panel. By doing this, the overall display of the display device will not be influenced. For example, FIG. 3 schematically shows a flexible display panel with a concealed power supply lead region in a more simplified manner. As shown in FIG. 3, three power supply lead regions 31, 32 and 33 in a display panel 3 are all concealed behind the plane of effective display regions AA of the flexible display panel 3. In FIG. 3, the three power supply lead regions 31, 32 and 33 concealed behind the plane of the effective display regions AA of the flexible display panel 3 are schematically shown in dashed lines. Since the flexible display panel has the characteristics of being bendable and deformable at random, the three power supply lead regions 31, 32 and 33 can be bent backwards and concealed behind the plane of the effective display regions AA. The lower part of FIG. 3 schematically shows that the power supply lead region 31 is bent behind the plane of the effective display regions AA in the form of an enlarged view. For example, the power supply lead region 31 can be bent into an arc shape and concealed behind the plane of the effective display regions AA. Alternatively, by taking advantage of the characteristics of bendability and deformability of the flexible display panel, the power supply lead region 31 can be deformed into other shapes and concealed behind the plane of the effective display regions AA. The concealment of each of the power supply lead regions 31, 32 and 33 behind the plane of the effective display regions AA prevents the display of the overall effective display region of the flexible display panel 3 from being influenced.

The flexible display panel provided in the embodiments of the present invention is especially suitable for display devices in a larger size. A larger flexible display panel can be manufactured on a substrate by a Roll-to-Roll process, and a corresponding power supply lead region can be manufactured during the manufacture of a pixel region, so as to realize a one-piece flexible display panel having improved luminance uniformity without manufacturing the display panel piece by piece and then stitching the pieces together. After that, the corresponding power supply lead region is concealed so as to prevent the overall display of the display panel from being influenced by the power supply lead region. Since the stitching process is saved, the manufacture process of a larger flexible display panel is simplified, and the manufacture cost is cut down.

According to another embodiment of the present invention, the width of the power supply lead in each power supply lead region can be set greater, for example, than that of the power supply connection line for directly providing electrical power to the pixels in each effective display region AA. By doing this, the total resistance of the power supply wiring in the effective display regions AA may be further reduced, the voltage drop on the power supply wiring may be further decreased and the luminance uniformity of the display panel is improved.

The power supply line mentioned in each embodiment of the present invention can be either a high level power supply line having a supply level VDD of the flexible display panel, or a low level power supply line having a low level VSS (e.g., a ground level), and the aforementioned power supply lead can be either a high level lead in electrical connection with the high level power supply line, or a low level lead in electrical connection with the low level power supply line. Throughout the text, the high level power supply line can also be called a VDD power supply line, and the low level power supply line can also be called a VSS power supply line; the high level lead can also be called a VDD lead, and the low level lead can also be called a VSS lead.

According to yet another embodiment of the present invention, the power supply lead region in the flexible display panel further comprises a GOA circuit. For example, a power supply lead region in the flexible display panel may comprise one VSS lead and two VDD leads on respective sides of the VSS lead, and it may further comprise two GOA circuits adjacent to the two VDD leads. Alternatively, a power supply lead region in another flexible display panel may comprise one VDD lead and two VSS leads on respective sides of the VDD lead, and it may further comprise two GOA circuits adjacent to the two VSS leads. Therefore, each power supply lead region can comprise a plurality of GOA circuits, and the plurality of GOA circuits can be symmetrically distributed on respective sides of the power supply leads in the power supply lead region. Such a symmetrical arrangement can make the voltages on respective sides of the power supply lead region symmetrical, which further ensures the overall display effect of the flexible panel. For a display panel having a larger size or higher resolution, the GOA circuits may have a problem of inadequate driving capacity. By arranging GOA circuits in the power supply lead region, the driving capacity of the flexible display panel in the effective display region can be enhanced. For example, assuming there are N pixels in each row in the overall effective display region of the flexible display panel, for a conventional flexible display panel, one stage of GOA circuits can be regarded as driving N/2 pixels since the GOA circuits can only be manufactured on both ends of the display panel. However, if two power supply lead regions comprising GOA circuits are arranged in the flexible display panel of this embodiment, one stage of GOA circuits can be regarded as driving N/4 pixels. Therefore, by arranging GOA circuits in the power supply lead region, the load of each GOA circuit can be reduced and the driving capacity of the GOA circuits can be enhanced, which is favorable for improving the luminance uniformity of the entire display panel.

As mentioned above, the power supply lead mentioned in each embodiment of the present invention can be either a high level lead (a VDD lead) in electrical connection with a high level power supply line having a supply level VDD among the power supply lines of the flexible display panel, or a low level lead (a VSS lead) in electrical connection with a low level power supply line having a low level VSS among the power supply lines of the flexible display panel. That is, each power supply lead region may comprise individually either a high level lead (a VDD lead) or a low level lead (a VSS lead). Alternatively, in other embodiments, the power supply lead can comprise both a VDD lead in electrical connection with a power supply line having the supply level VDD among the power supply lines of the flexible display panel, and a VSS lead in electrical connection with a power supply line having the low level VSS among the power supply lines of the flexible display panel. That is, each power supply lead region may comprise both a VDD lead and a VSS lead. In this case, the power supply lead region may comprise VDD leads and VSS leads arranged alternately.

In an embodiment, the high level lead (the VDD lead) can be arranged in the layer of the gate of a pixel switch in the pixel array, and the low level lead (the VSS lead) can be arranged in the layer of the source and the drain of the pixel switch in the pixel array.

Figure 4A:
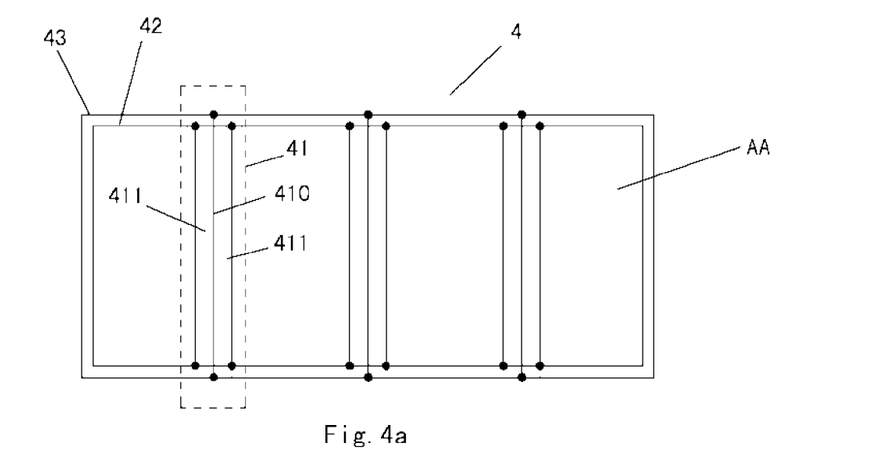
FIG. 4a schematically shows a planar view of the overall power supply wiring of a flexible display panel according to another embodiment of the present invention.

FIG. 4a schematically shows a planar view of the overall power supply wiring of a flexible display panel according to another embodiment of the present invention. A flexible display panel 4 comprises a VDD power supply line 42 and a VSS power supply line 43 arranged peripherally around the overall effective display region, as well as three power supply lead regions. Each power supply lead region can comprise VDD leads and VSS leads arranged alternately. For example, the power supply lead region 41 can comprise one VSS lead 410 and two VDD leads 411 arranged symmetrically on respective sides of the VSS lead 410. By arranging the two VDD leads 411 symmetrically in the power supply lead region 41, voltages at respective sides of the power supply lead region 41 may be symmetrical, which further ensures the overall display effect of the flexible panel. The VSS lead 410 is electrically connected with the VSS power supply line 43, and the two VDD leads 411 are electrically connected with the VDD power supply line 42.

Figure 4B:
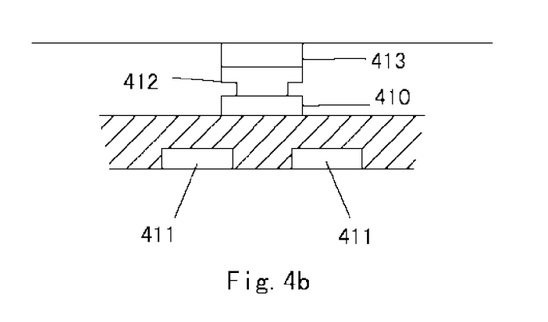
FIG. 4b schematically shows a sectional view of a power supply lead region 41 as shown in FIG. 4a obtained along a horizontal line perpendicular to the power supply lead in the plane of the power supply lead region 41.

In this embodiment of the present invention, the flexible display panel can be an OLED display panel, in this case, the VSS leads in the power supply lead regions can be electrically connected with the cathode of the OLED via a metal layer so as to further reduce the total resistance of the power supply wiring. For example, FIG. 4b schematically shows a sectional view of a power supply lead region 41 as shown in FIG. 4a obtained along a horizontal line perpendicular to the power supply lead in the plane of the power supply lead region 41, and it also schematically shows that the VSS lead in the power supply lead region 41 is in electrical connection with the cathode of the OLED. As shown in FIG. 4b, the layers of the two VDD leads 411 can be arranged below the layer of the VSS lead 410, and the VSS lead 410 can be electrically connected with an OLED cathode 413 via a metal layer 412. The metal layer 412 can be a via hole filled with metals between the layer of the VSS lead 410 and the OLED cathode 413, which not only enhances the solidity of the pixel structure but also further reduces the total resistance of the power supply wiring to decrease the voltage drop on the power supply wiring. An insulation layer can be further provided between the layers of the two VDD leads 411 and between the layer of VDD lead 411 and the layer of VSS lead 410 respectively.

Figure 5A:
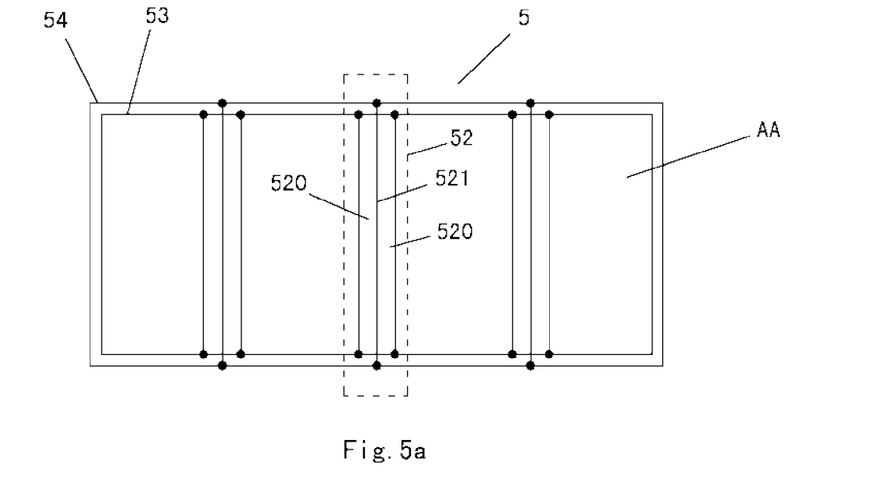
FIG. 5a shows a planar view of the overall power supply wiring of a flexible display panel according to yet another embodiment of the present invention.

FIG. 5a schematically shows a planar view of the overall power supply wiring of a flexible display panel according to yet another embodiment of the present invention. A flexible display panel 5 comprises a VDD power supply line 54 and a VSS power supply line 53 arranged peripherally around the overall effective display region, as well as three same power supply lead regions 52. Different from the embodiment as shown in FIG. 4a, each power supply lead region 52 can comprise one VDD lead 521 and two VSS leads 520 arranged symmetrically on respective sides of the VDD lead 521, i.e., forming alternating VDD leads and VSS leads. By arranging the two VSS leads 520 symmetrically in the power supply lead region 52, the voltages at respective sides of the power supply lead region 52 can be symmetrical, which further ensures the overall display effect of the flexible panel. The VDD lead 521 is electrically connected with the VDD power supply line 54, and the two VSS leads 520 are electrically connected with the VSS power supply line 53.

Figure 5B:
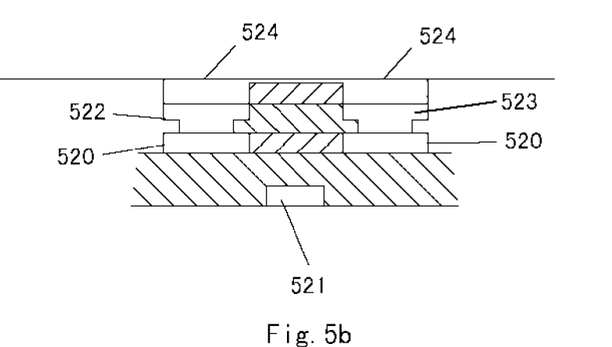
FIG. 5b schematically shows a sectional view of a power supply lead region 52 as shown in FIG. 5a obtained along a horizontal line perpendicular to the power supply lead in the plane of the power supply lead region 52.

Likewise, in case the flexible display panel is an OLED display panel, the VSS leads in the power supply lead regions can be electrically connected with the cathode of the OLED via a metal layer, so as to further reduce the total resistance of the power supply wiring. For example, FIG. 5b schematically shows a sectional view of the power supply lead region 52 as shown in FIG. 5a obtained along a horizontal line perpendicular to the power supply lead in the plane of the power supply lead region 52, and it also schematically shows that the VSS leads in the power supply lead region 52 are in electrical connection with the cathode of the OLEDs. As shown in FIG. 5b, the layers of the two VSS leads 520 can be arranged above the layer of the VDD lead 521, and the two VSS leads 520 can be electrically connected with an OLED cathode 524 via metal layers 522 and 523 respectively. The metal layers 522 and 523 can be via holes filled with metals between the layer of the VSS leads 520 and the OLED cathode 524, which not only enhances the solidity of the pixel structure but also further reduces the total resistance of the power supply wiring to decrease the voltage drop on the power supply wiring. An insulation layer can be further provided between the two VSS leads 520, between the metal layers 522 and 523, and between the VDD lead 521 and the VSS leads 520 respectively.

Figure 6A:
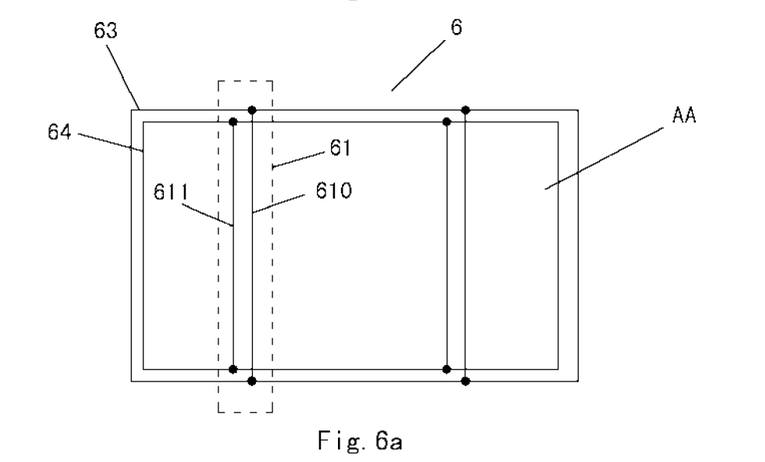
FIG. 6a shows a planar view of the overall power supply wiring of a flexible display panel according to still another embodiment of the present invention.
Figure 6B:
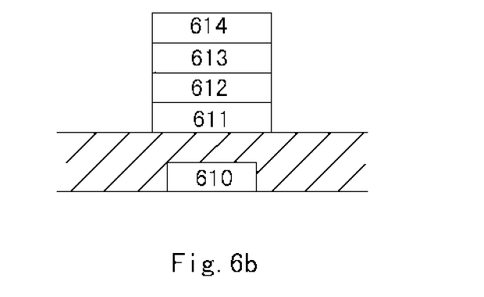
FIG. 6b schematically shows a sectional view of a power supply lead region 61 as shown in FIG. 6a obtained along a horizontal line perpendicular to the power supply lead in the plane of the power supply lead region 61.

In still another embodiment of the present invention, the flexible OLED display panel may further comprise another layer of VSS lead arranged on the cathode of the OLED for further reducing the total resistance of the power supply wiring and further decreasing the voltage drop on the power supply wiring. FIG. 6a shows a planar view of the overall power supply wiring of a flexible display panel according to still another embodiment of the present invention. A flexible display panel 6 comprises a VDD power supply line 63 and a VSS power supply line 64 arranged peripherally around the overall effective display region, as well as two same power supply lead regions. Each power supply lead region 61 comprises one VDD lead 610 and one VSS lead 611, the VDD lead 610 is in electrical connection with the VDD power supply line 63, and the VSS lead 611 is in electrical connection with the VSS power supply line 64. FIG. 6b schematically shows a sectional view of the power supply lead region 61 as shown in FIG. 6a obtained along a horizontal line perpendicular to the power supply lead in the plane of the power supply lead region 61, and it also schematically shows another layer of VSS lead 614 arranged above an OLED cathode 613. As can be seen from FIG. 6b, the layer of the VDD lead 610 is below the layer of the VSS lead 611, and the VSS lead 611 is electrically connected with the OLED cathode 613 via a metal layer 612. Besides, another layer of VSS lead 614 is further evaporated on the OLED cathode 613, thereby further reducing the total resistance of the power supply wiring, and enhancing and improving the effect of luminance uniformity of the OLED flexible display panel.

In other embodiments, a display device comprising the flexible display panel described in any of the embodiments mentioned above is further provided. Since the flexible display panel adopts such a particular power supply wiring, the luminance uniformity of the display screen of the display device can be improved. Besides, in order to improve the luminance uniformity of the display device, the embodiments of the present invention further provide a method for manufacturing a flexible display panel. The method may comprise the following steps:

Arranging at least one power supply lead region in the flexible display panel, thereby obtaining a plurality of effective display regions of the flexible display panel;

Arranging at least one power supply lead in the power supply lead region, the power supply lead being in electrical connection with the power supply line of the flexible display panel; and the effective display regions and the power supply lead region are arranged alternately.

By specially arranging power supply lead regions in the flexible display panel in this manner, the total resistance of the power supply wiring in the effective display region can be reduced. As a result, the voltage drop on the power supply wiring can be decreased, and thereby the supply voltage VDD of the flexible display panel is provided to each pixel circuit evenly, which improves the luminance uniformity of the display panel.

For the final display panel, the method for manufacturing a flexible display panel can further comprise concealing the power supply lead region behind the plane of the effective display region of the flexible display panel. For example, by taking advantage of the characteristics of bendability and deformability of the flexible display panel, the power supply lead region can be bent and concealed behind the plane of the effective display region of the flexible display panel.

The method for manufacturing a flexible display panel provided in the embodiments of the present invention is especially suitable for the manufacture of display panels in a larger size. A larger flexible display panel can be manufactured on a substrate by a Roll-to-Roll process, and a corresponding power supply lead region can be manufactured during the manufacture of a pixel region so as to realize a one-piece flexible display panel having improved luminance uniformity, without manufacturing the display panel piece by piece and then stitching the pieces together. After that, the corresponding power supply lead region is concealed so as to prevent the overall display of the display panel from being influenced by the power supply lead region. Since the stitching process is saved, the manufacture process of a flexible display panel is simplified, and the manufacture cost is cut down.

Although the exemplary embodiments of the present invention have been described in details with reference to the drawings, such descriptions should be considered as illustrative or exemplary instead of restrictive. The present invention is not limited to the embodiments that have been disclosed. Different embodiments described above and in the claims can also be combined. Other variations to the disclosed embodiments can be understood and effected by those skilled in the art in practicing the claimed invention, from a study of the drawing, the disclosure and the appended claims.

In the claims, the word "comprising" does not exclude the presence of other components or steps. The mere fact that several technical measures are stated in mutually different dependent claims does not indicate that the combination of these technical measures cannot be used to advantage.

What is claimed is:

1. A flexible display panel, comprising:
   a plurality of effective display regions, wherein each effective display region comprises:
   a pixel array; and
   at least one power supply lead region, which comprises at least one power supply lead directly connected with a power supply line in the flexible display panel;
   wherein the effective display regions and the power supply lead region are arranged alternately,
   wherein the power supply lead region further comprises a gate driving circuit.

2. The flexible display panel according to claim 1, wherein the power supply lead region is concealed behind the plane of the effective display regions of the flexible display panel.

3. The flexible display panel according to claim 2, wherein the power supply lead is either a high level lead in electrical connection with a high level power supply line having a supply level among the power supply lines of the flexible display panel, or a low level lead in electrical connection with a low level power supply line having a low level among the power supply lines of the flexible display panel.

4. The flexible display panel according to claim 3, wherein the high level lead is arranged in the layer of the gate of a pixel switch in the pixel array, and the low level lead is arranged in the layer of the source and the drain of the pixel switch in the pixel array.

5. The flexible display panel according to claim 2, wherein the power supply lead comprises both a high level lead in electrical connection with a high level power supply line having a supply level among the power supply lines of the flexible display panel, and a low level lead in electrical connection with a low level power supply line having a low level among the power supply lines of the flexible display panel.

6. The flexible display panel according to claim 5, wherein the high level lead is arranged in the layer of the gate of a pixel switch in the pixel array, and wherein the low level lead is arranged in the layer of the source and the drain of the pixel switch in the pixel array.

7. The flexible display panel according to claim 5, wherein the power supply lead region comprises high level leads and the low level leads arranged alternately.

8. The flexible display panel according to claim 7, wherein the high level leads or the low level leads are symmetrically arranged in the power supply lead region.

9. The flexible display panel according to claim 8, wherein the flexible display panel is an OLED display panel, wherein the low level lead is further electrically connected to an OLED cathode via a metal layer.

10. The flexible display panel according to claim 9, wherein the flexible display panel further comprises another layer of low level lead arranged on the OLED cathode.

11. The flexible display panel according to claim 1, wherein the width of the power supply lead is greater than that of the power supply connection line for directly providing electrical power to the pixels in each effective display region.

12. A display device, comprising a flexible display panel, the flexible display panel comprising:
- a plurality of effective display regions, each effective display region comprising a pixel array;
- at least one power supply lead region, which comprises at least one power supply lead directly connected with a power supply line in the flexible display panel;
- wherein the effective display regions and the power supply lead region are arranged alternately,
- wherein the power supply lead region further comprises a gate driving circuit.

* * * * *